United States Patent
Mariconti et al.

(10) Patent No.: US 10,461,730 B1
(45) Date of Patent: Oct. 29, 2019

(54) ADAPTIVE MULTI-LEVEL GATE DRIVER

(71) Applicant: Infineon Technologies Austria AG, Villach (AT)

(72) Inventors: Andrea Luigi Francesco Mariconti, Pavia (IT); Wolfgang Frank, Augsburg (DE); Christian Locatelli, Pavia (IT); Diego Raffo, Redondo Beach, CA (US); Davide Respigo, Pavia (IT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/124,844

(22) Filed: Sep. 7, 2018

(51) Int. Cl.
*H03K 17/0412* (2006.01)

(52) U.S. Cl.
CPC .............. *H03K 17/0412* (2013.01)

(58) Field of Classification Search
CPC .................................................. H03K 17/0412
See application file for complete search history.

(56) References Cited

U.S. PATENT DOCUMENTS 5,796,276 A * 8/1998 Phillips ............... H03K 17/063
323/315

* cited by examiner

*Primary Examiner* — Daniel C Puentes
(74) *Attorney, Agent, or Firm* — Slater Matsil, LLP

(57) ABSTRACT

A gate driver circuit for driving a power switch includes a gate driver having a first input for receiving an input signal and an output coupled to the power switch, the gate driver providing a primary gate current and an auxiliary gate current, and a differential voltage sensor having a first input for receiving the input signal, a second input coupled to a power supply voltage, a third input coupled to a terminal of the power switch, and an output coupled to a second input of the gate driver.

21 Claims, 17 Drawing Sheets

$V_{CE}$, collector-emitter voltage

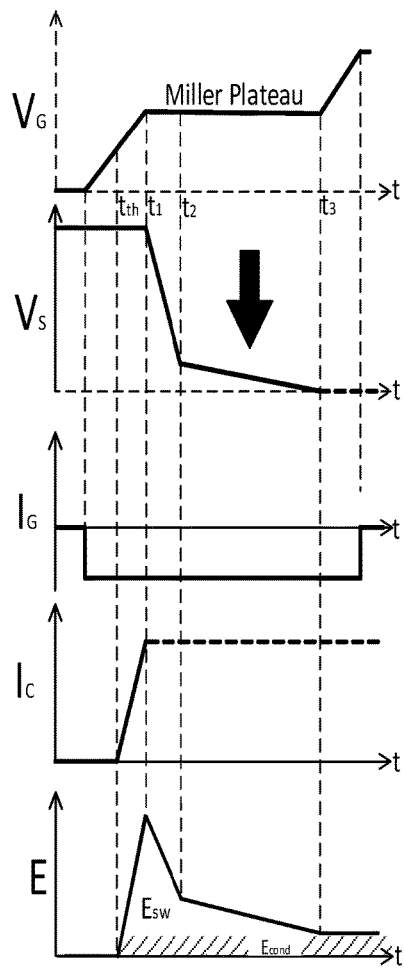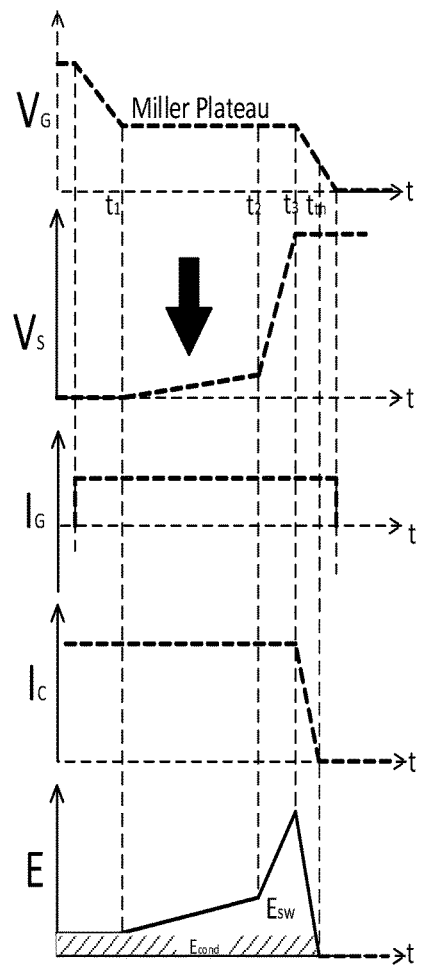
Fig. 3A
Prior Art
Fig. 3B
Prior Art

ADAPTIVE MULTI-LEVEL GATE DRIVER

TECHNICAL FIELD

The present invention relates generally to a system and method for an adaptive multi-level gate driver.

BACKGROUND

FIG. 1A is a schematic 100 of an Integrated Gate Bipolar Transistor ("IGBT") 102 including parasitic capacitances $C_M$ coupled between the gate and the collector, $C_{GE}$ coupled between the gate and the emitter, and $C_{CE}$ coupled between the collector and the emitter.

FIG. 1B is a graph of values of the parasitic capacitances shown in FIG. 1A with respect to collector-emitter voltage, wherein $C_{ISS}$ represents the sum of the $C_M$ and $C_{GE}$ capacitors, $C_{OSS}$ represents the sum of the $C_M$ and $C_{CE}$ capacitors, and $C_M$ represents the Miller capacitor, which is highly non-linear due the gain of IGBT 102, as is known in the art. The values of capacitors $C_{ISS}$, $C_{OSS}$, and $C_M$ are relatively high for a low collector-emitter voltage, and rapidly decrease during an initial increase in the collector-emitter voltage, and then asymptotically approach a minimum value at high collector-emitter voltages.

FIG. 2A is a schematic diagram 200 of a prior art power switch including a high side driver 206 and a low side driver 204, a high side gate resistor RgHS and a low side gate resistor RgLS, as well as a high side power transistor T1 and a low side power transistor T2. Voltages $V_{CE}$ (collector-to-emitter voltage), $V_G$ (gate voltage), and $V_{OUT}$ (voltage from the low side gate driver), and currents $I_G$ (gate current) and $I_C$ (collector current) associated with the low side driver are shown in FIG. 2A.

For a specified gate resistor, it takes a relatively long time to charge and discharge the parasitic capacitances shown in FIG. 1A. Therefore, the propagation delay of the power transistors shown in FIG. 2A is also relatively high. Portions of the propagation delay of the power transistors is referred to as "dead time" that must be considered in half-bridge applications in order to avoid cross-conduction. Large propagation delays for both the high side device and the low side device of a half-bridge power switch exist dominantly at turn-off when the collector-to-emitter voltage ("VCE") or the drain-to-source voltage ("VDS") is low. As depicted in FIG. 1B, in this case the Miller capacitance is very high. The long propagation delay causes a large dead time as the propagation delay at turn-on is short. This causes disadvantages in efficiency and precise timing.

One solution for addressing propagation delays is by a suitable selection of the gate resistors RgLS and RgHS. The lower the gate resistance, the shorter the propagation delay. However, the gate resistance also specifies switching speed. Hence, the selection of the gate resistor Rg is limited by other design constraints, such as dv/dt restrictions of Electro-Magnetic Interference ("EMI") limitations.

FIG. 2B is a timing diagram associated with the power switch of FIG. 2A showing the $V_{OUT}$, $V_G$, $I_G$, $V_{CE}$, and $I_C$ waveforms for a given value of RgHS and RgLS. Also shown in FIG. 2B is the $I_{OFF}$ waveform, which is the turn off current.

FIG. 3A is a more detailed timing diagram associated with a turn-on phase of the low side of the power switch of FIG. 2A and FIG. 3B is a more detailed timing diagram associated with a turn-off phase of the low side of the power switch of FIG. 2A. The waveforms shown in FIGS. 3A and 3B include the gate voltage ($V_G$), output voltage ($V_S$), gate current ($I_G$), collector current ($I_C$), and energy losses (E). The time parameters along the horizontal time axis of these waveforms include: $t_{TH}$ (time when the threshold voltage is achieved), $t_1$ (time when the Miller plateau starts), $t_2$ (time when the tail begins in the turn-on mode or ends in the turn-off mode), and $t_3$ (time when the Miller plateau finishes).

In the waveforms of FIGS. 3A and 3B, which show the energy losses (E), the energy consumed during the switching of the power transistors is labeled $E_{SW}$, whereas the energy consumed by conduction is labeled $E_{COND}$. Note that the energy consumed during switching of the power transistors includes a spiked portion and a long "tail" portion. The elongated tail is visible in the clearly marked arrow portions of the output voltage ($V_S$) waveforms. The energy losses indicated by the tail portion lead to large power switching losses.

It is thus an object of the present invention to reduce propagation delays and power switching losses during switching of power switches.

SUMMARY

According to embodiment methods and circuits, dead time and the tail phenomenon are both minimized, which in turn improves switching efficiency and allows for more precise switch timing of a power switch.

According to an embodiment, a gate driver circuit for driving a power switch comprises a gate driver having a first input for receiving an input signal and an output coupled to the power switch, the gate driver configured for providing a primary gate current and an auxiliary gate current; and a differential voltage sensor having a first input for receiving the input signal, a second input coupled to a power supply voltage, a third input coupled to a terminal of the power switch, and an output coupled to a second input of the gate driver.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A is a timing diagram associated with a turn-on phase of the low side of the power switch of FIG. 2A;

FIG. 3B is a timing diagram associated with a turn-off phase of the low side of the power switch of FIG. 2A;

DETAILED DESCRIPTION OF ILLUSTRATIVE EMBODIMENTS

According to an embodiment, the gate current of the output stage of the gate driver for a power switch is configured, to depend upon the difference between the output voltage $V_S$ of the switch and the supply voltages of the switch ($V_{SS}$ and DC+). Typically $V_{SS}$ is a negative voltage supply or ground and DC+ is a positive voltage supply. The absolute value of these voltages can range from the tens of volts to hundreds of volts as required for a specific application and as allowed by a specific switch technology.

Figure 1A:
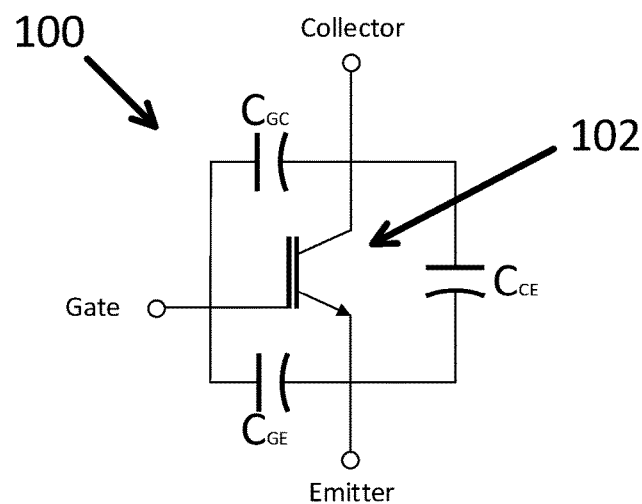
FIG. 1A is a schematic of an IGBT including parasitic capacitances, as is known in the art.
Figure 1B:
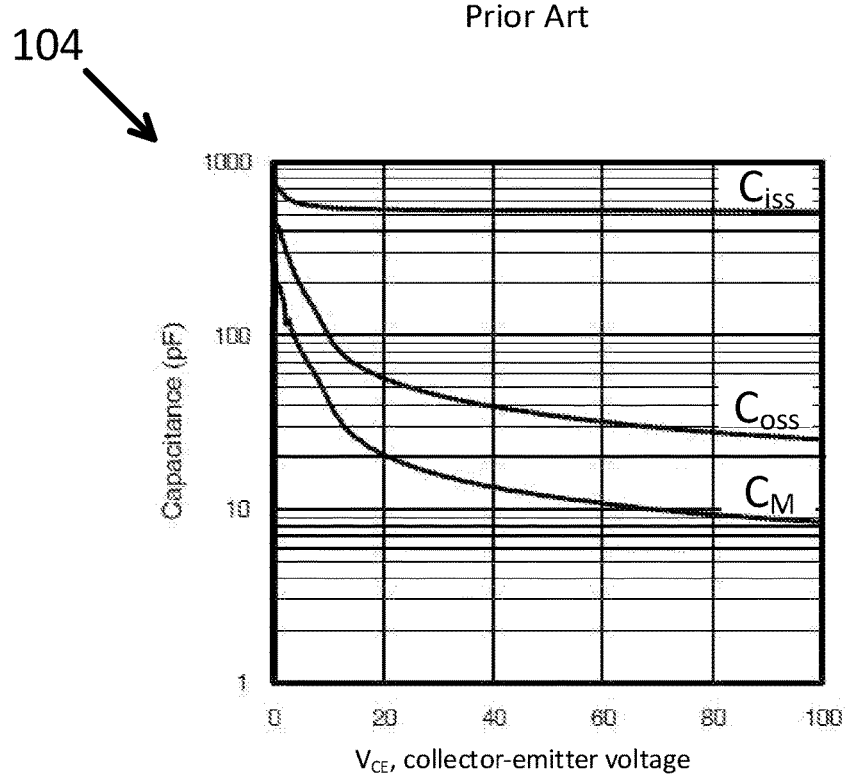
FIG. 1B is a graph of values of the parasitic capacitances shown in FIG. 1A with respect to collector-emitter voltage.
Figure 2A:
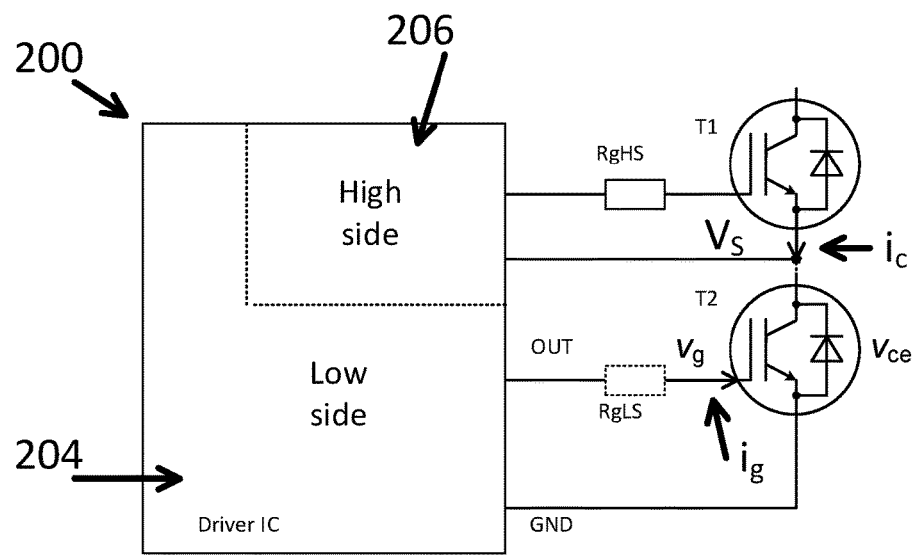
FIG. 2A is a schematic diagram 200 of a prior art power switch including a high side driver and a low side driver, as well as high side and low side gate resistors.
Figure 2B:
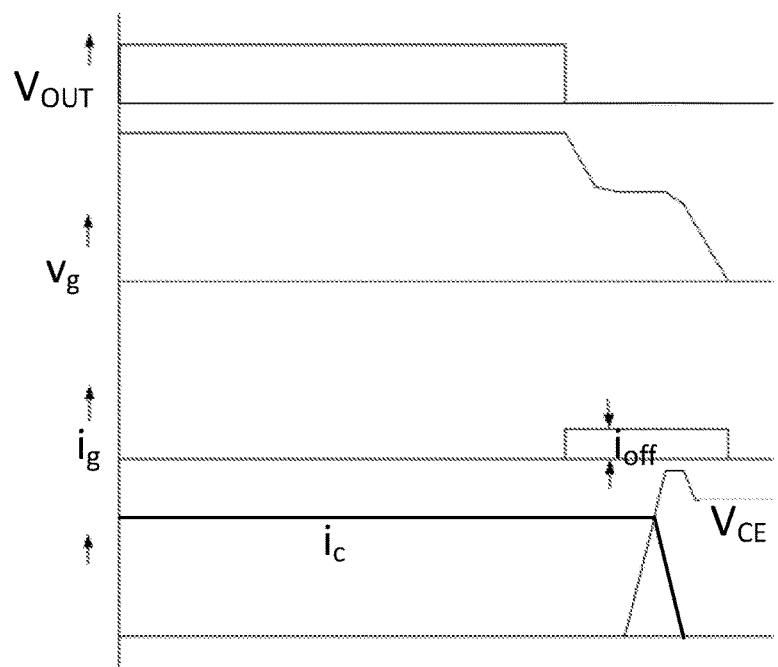
FIG. 2B is a timing diagram associated with the power switch of FIG. 2A.
Figure 4A:
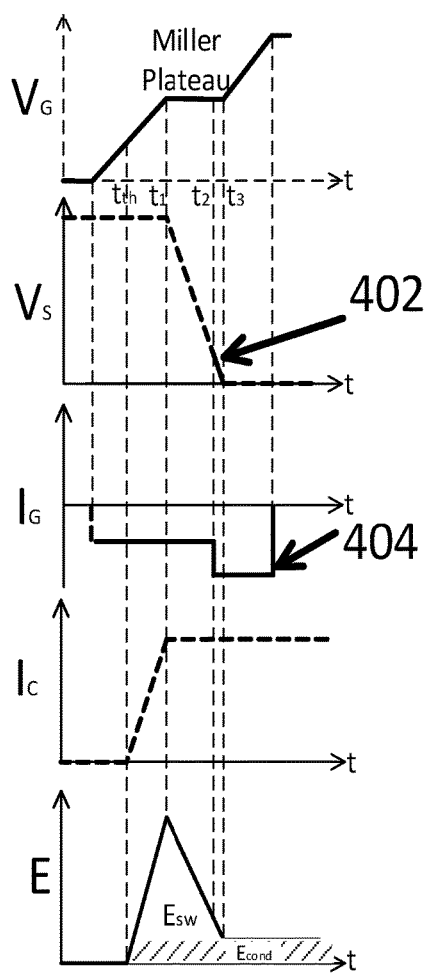
FIG. 4A is a timing diagram associated with a turn-on phase of the low side of a power switch according to an embodiment.
Figure 4B:
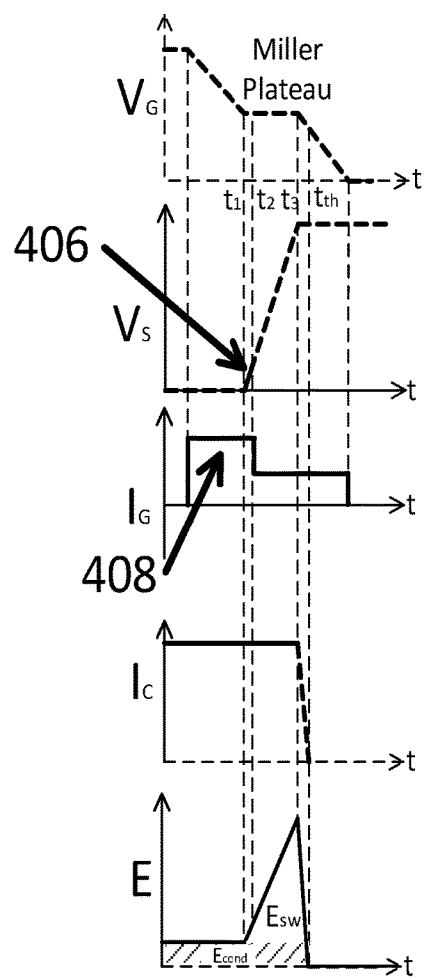
FIG. 4B is a timing diagram associated with a turn-off phase of the low side of the power switch according to an embodiment.

FIG. 4A is a timing diagram associated with a turn-on phase of the low side of a power switch according to an embodiment, and FIG. 4B is a timing diagram associated with a turn-off phase of the low side of the power switch according to an embodiment.

The following waveforms are shown in FIGS. 4A and 4B: gate voltage ($V_G$); output voltage ($V_S$); gate current ($I_G$); collector current ($I_C$); energy losses (E). The energy losses are shown having an $E_{SW}$ and an $E_{COND}$ portion as previously described. Portion 402 of the $V_S$ waveform (between times $t_2$ and $t_3$) indicate an erased tail during turn-on. Portion 404 of the $I_G$ waveform (between times $t_2$ and $t_4$) shows a boost gate current. Portion 406 of the $V_S$ waveform (between times $t_1$ and $t_2$) indicate an erased tail during turn-off. Portion 408 of the $I_G$ waveform (between times $t_0$ and $t_2$) again shows the boost gate current. By boosting the gate current during portions 404 and 408 of the $I_G$ waveforms, the tails in portions 402 and 406 of the $V_S$ waveforms can be erased. This enables minimizing switching losses and the dead time, while also keeping the dv/dt of the switching devices within the limits imposed by EMI regulations.

Comparing the timing diagrams of FIGS. 4A and 4B with the timing diagrams of FIGS. 3A and 3B, it is clear to see a reduction of the $E_{SW}$ energy losses, obtained by the boosted gate currents that are provided by circuit embodiments that are described in further detail below.

Figure 5A:
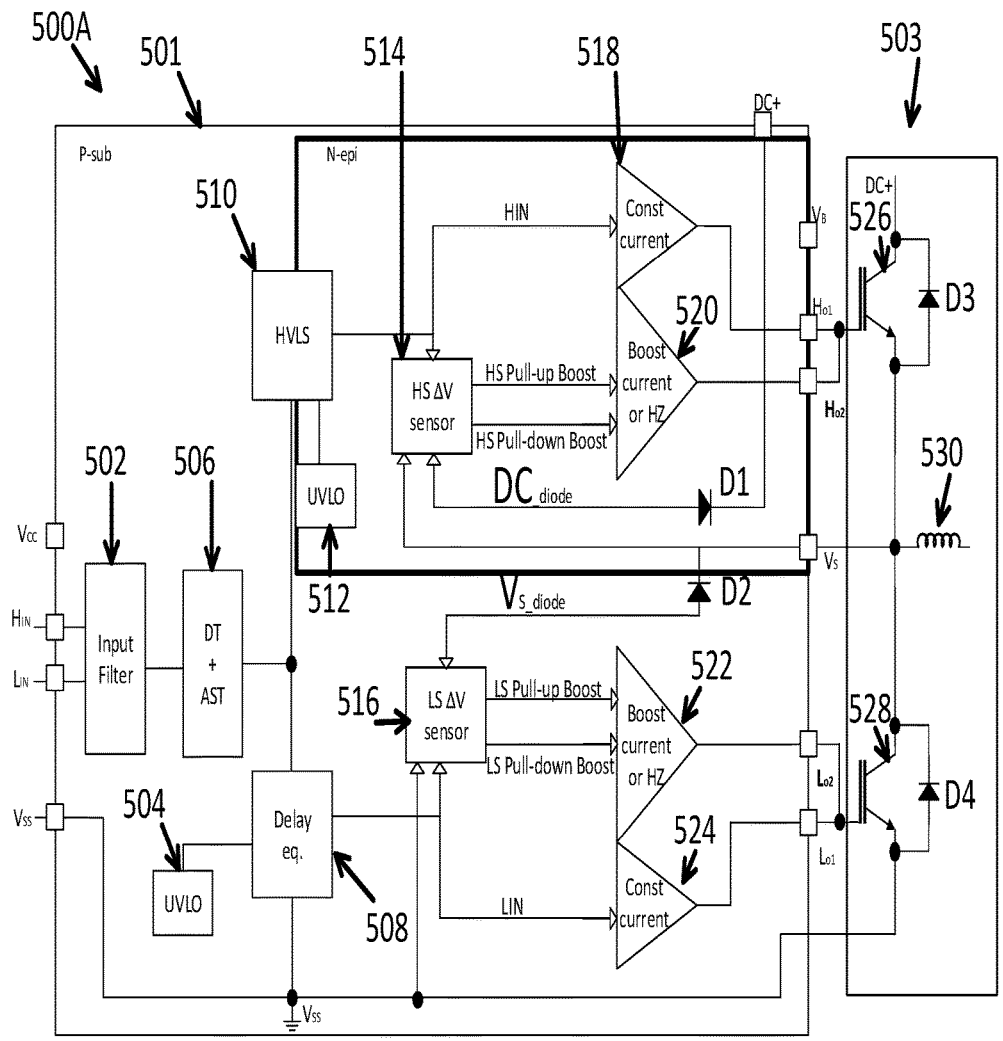
FIG. 5A is a block diagram of an integrated circuit gate driver and a half bridge power switch of a power switching system according to an embodiment.
Figure 14:
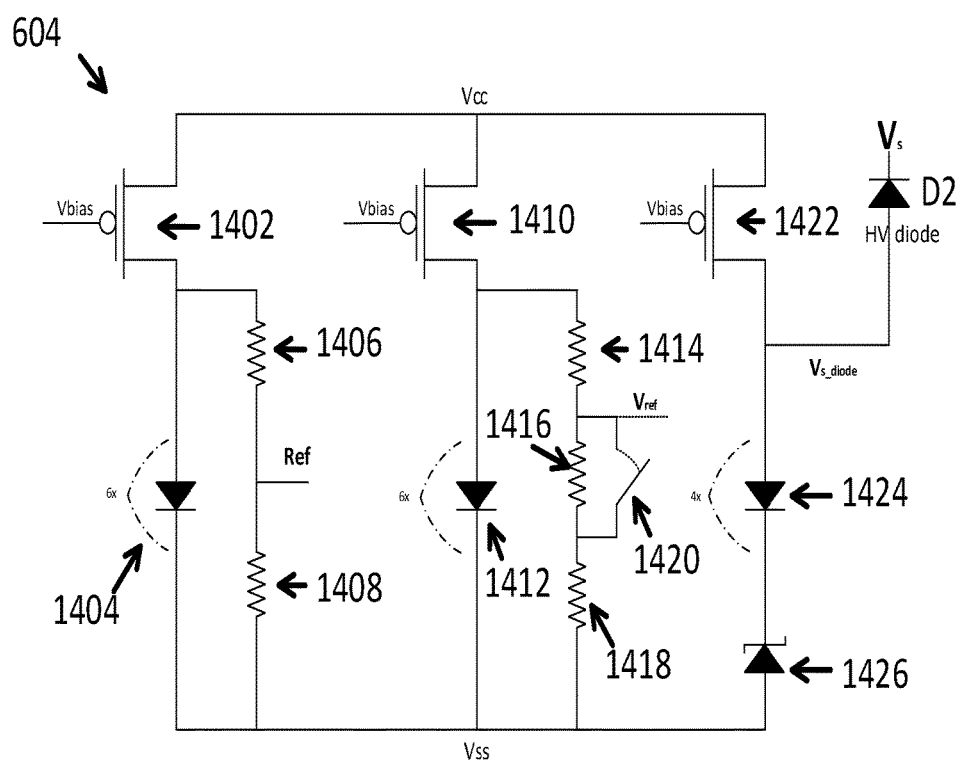
FIG. 14 is a schematic diagram of an input stage suitable for use in the low side differential voltage sensor of FIG. 6.
Figure 15:
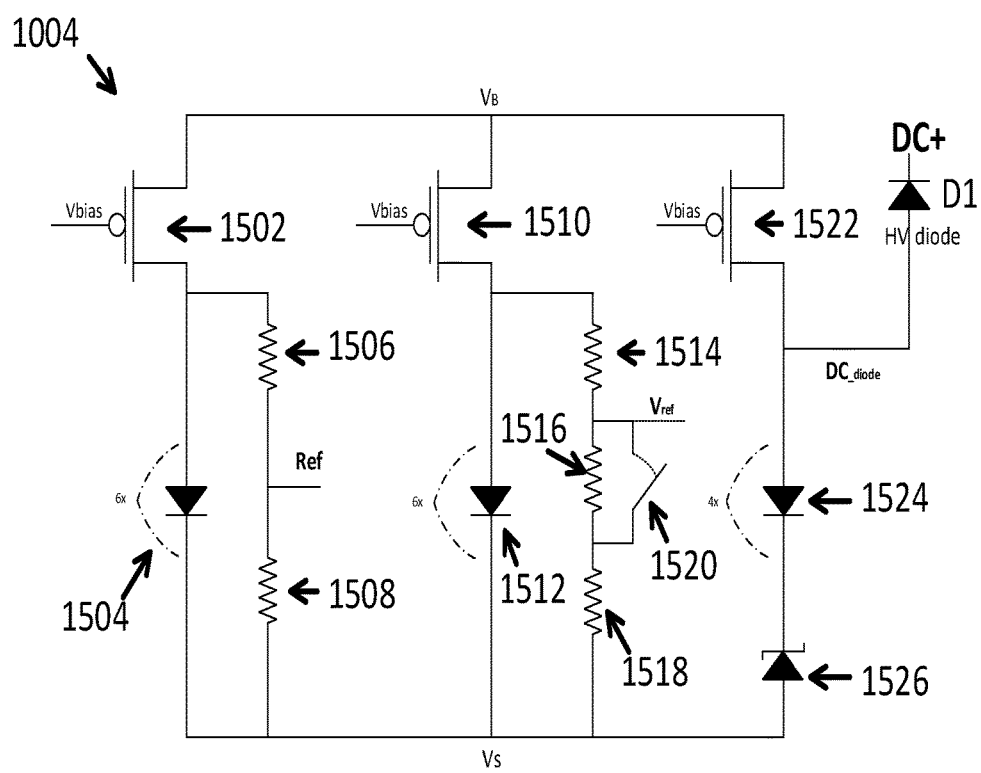
FIG. 15 is a schematic diagram of an input stage suitable for use in the high side differential voltage sensor of FIG. 10.

Referring to FIG. 5A, the difference between the output voltage VS and the supply voltages (this difference hereinafter identified as ΔV) is obtained using diodes D1 and D2; at the low side $V_S-V_{SS}=\Delta V_{LS}$, while at the high side DC+$-V_S=\Delta V_{HS}$. Depending on these differential voltages and on the on/off state of the power transistor (which is known by the user), the correct level of gate boost current is provided at the gate of the high side and low side power devices, during both turn-on and turn-off phases. The exact mechanism for creating the differential voltages $\Delta V_{LS}$ and $\Delta V_M$ is explained in further detail below, particularly with the description of input stages that are shown in FIGS. 14 and 15.

Through the analysis of previous power switch datasheets and testing, an average value (threshold) of ΔV was found at which $V_S$ starts showing the previously described tail phenomenon (see arrow portions in FIGS. 3A and 3B). This threshold value of ΔV is hereinafter referred to as $\Delta V_{th}$. The initial portion of the tail phenomenon corresponds to the peak value of the Miller capacitance. Once ΔV reaches or falls below $\Delta V_{th}$, the gate current is boosted. These voltage thresholds and the implementation of them in a gate driver circuit for driving power switching devices is described in further detail below.

FIG. 5A is a block diagram of an integrated circuit gate driver 501 and a half bridge power switch 503 of a power switching system 500A according to an embodiment. The power switching system is substantially symmetrical as it is comprised of similar blocks both at low and at high side. The integrated circuit gate driver 501 is described below. The half bridge power switch 503 includes high side power device 526 such as an IGBT coupled between DC+ and the output voltage node $V_S$, which in turn is coupled to a load 530. While an inductive load is shown, other types of loads are known in the art. A freewheeling diode D3 is coupled across the current path of power device 526, in an embodiment. The half bridge power switch 503 also includes low side power device 528 such as an IGBT coupled between the output voltage node $V_S$, and the $V_{SS}$ power supply node, which is shown as ground in an embodiment. A freewheeling diode D4 is coupled across the current path of power device 528, in an embodiment.

An embodiment integrated circuit gate driver 501 is shown in FIG. 5A, including the following pins (in clockwise order): DC+ (positive power supply voltage), $V_B$ (internal biasing node), $H_{O1}$ (first high side gate driver output), $H_{O2}$ (second high side gate driver output), $V_S$ (output voltage node), $L_{O2}$ (second low side gate driver output), $L_{O1}$ (first low side gate driver output), $V_{SS}$ (ground or negative supply voltage), $L_{IN}$ (low side input signal), $H_{IN}$ (high side input signal), $V_{CC}$ (additional positive power supply voltage).

Gate driver integrated circuit 501 includes a high side constant current driver 518 having an input for receiving a high side input signal HIN and an output coupled to the control node of the high side power device at pin H01; a high side boost current driver 520 having a first input for receiving the HS Pull-up Boost signal, a second input for receiving the HS Pull-down Boost signal, and an output coupled to the control node of the high side power device 526 at pin H02

(OUTBOOST); and a high side sensor and differentiator circuit 514 having an input coupled to the positive voltage source DC+ through diode D1, an input coupled to the output node $V_S$, an input for receiving the high side input signal HIN, and first and second outputs coupled to the first and second inputs of the high side boost current driver 520. Based on the inputs respectively coupled to the positive voltage source DC+ and to the output node $V_S$, high side sensor and differentiator circuit 514 can obtain the aforementioned voltage difference $\Delta V_{HS} = DC+ - V_S$.

Gate driver integrated circuit 501 includes a low side constant current driver 524 having an input for receiving a low side input signal $L_{IN}$ and an output coupled to the control node of the low side power device at pin L01; a low side boost current driver 522 having a first input for receiving a LS Pull-up Boost signal, a second input for receiving a LS Pull-down Boost signal, and an output coupled to the control node of the low side power device 528 at pin Lot (OUTBOOST); and a low side sensor and differentiator circuit 516 having an input coupled to the output node $V_S$ through diode $D_2$, an input coupled to the negative supply voltage $V_{ss}$, an input for receiving the low side input signal LIN, and first and second outputs coupled to the first and second inputs of the low side boost current driver 522. Based on the inputs respectively coupled to the output node $V_S$ and the negative voltage source $V_{ss}$, low side sensor and differentiator circuit 516 can obtain the aforementioned voltage difference $\Delta V_{LS} = V_S - V_{SS}$.

Also shown in integrated circuit gate driver 501 are the following blocks: input filter 502, DT+AST block 506 (DT=dead time circuit used to insert a time interval between the high side and low side switching signals in order avoid simultaneous switching of the power devices, AST=Anti-Shot-Through circuit used in order to avoid cross-conduction between the low side and the high side power devices), UVLO block 504 (UVLO=Under Voltage Lock Out circuit used to protect the driver circuit in case of a supply power loss), delay equalizer block 508 (delay equalizer circuit used to introduce a delay to equalize the propagation delay in the high and low voltage domains), HVLS block 510 (HVLS=High Voltage Level Shifter circuit needed to pass the input signal voltage from the low side to the high side, and also when necessary for proper functioning in very high voltage domains). The abbreviation "HZ" is also used in FIG. 5A, referring to high side boost current driver 520 and low side boost current driver 522. The abbreviation "HZ" refers to a high impedance output state in which drivers 520 and 522 can be placed when not supplying the boosted gate current pulses as is described in further detail below. The auxiliary stages 520 and 522 are set in order to show a high impedance (HZ) whenever the auxiliary boost current is not needed. Gate driver circuit 501 can be configured to omit some of the above described functional blocks for a specific application, or to add additional functional blocks for a specific application as desired.

Finally, lower voltages blocks 502, 504, 506, 508, 516, 522, 524, and D2 can all be integrated on a P-substrate portion of the gate driver integrated circuit 501. In order to prevent voltage breakdown on the chip, high voltage blocks 510, 512, 514, 518, 520, and D1 can all be integrated on an N-epitaxial portion of the gate driver integrated circuit 501.

While a half-bridge embodiment has been shown and described with respect to FIG. 5A, single transistor power switch embodiments can also be used. Single transistor power switching systems are described below with reference to FIGS. 5B and 5C. Full-bridge embodiments including four power transistors or devices (not shown) can also be used, according to embodiments.

Figure 5B:
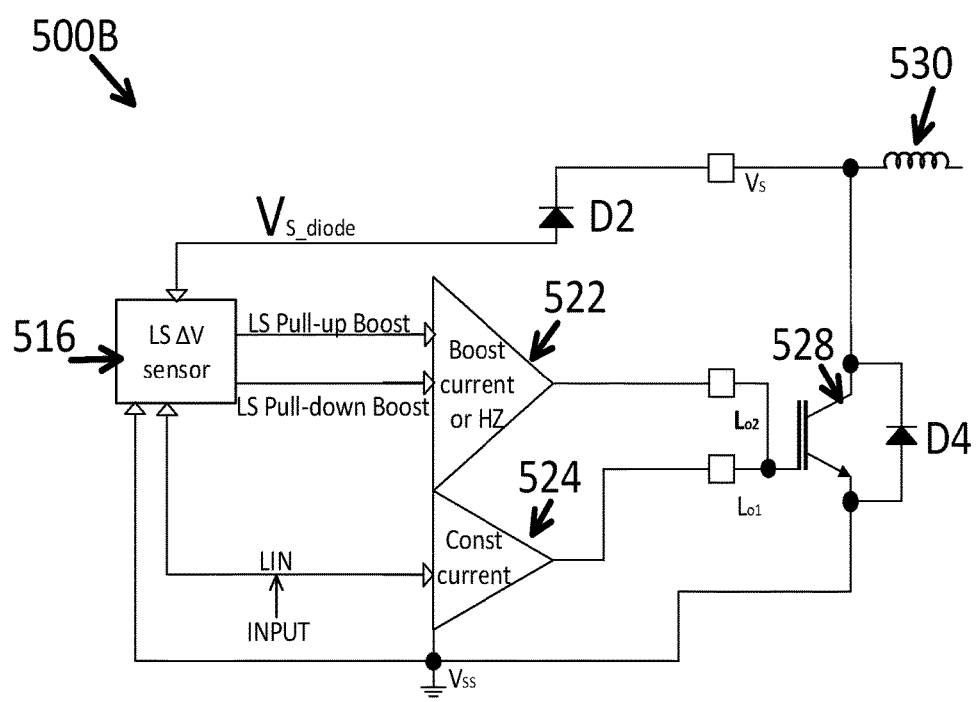
FIG. 5B is a block diagram of a gate driver, a differential voltage sensor, and a single transistor power switch referenced to a first power supply voltage according to an embodiment.

FIG. 5B is a block diagram of a power switching system 500B including a gate driver 522, 524, a low side differential voltage sensor 516, diodes D2 and D4, and a single transistor power switch 528 having an emitter referenced to $V_{SS}$ and a collector coupled to load 530.

Figure 5C:
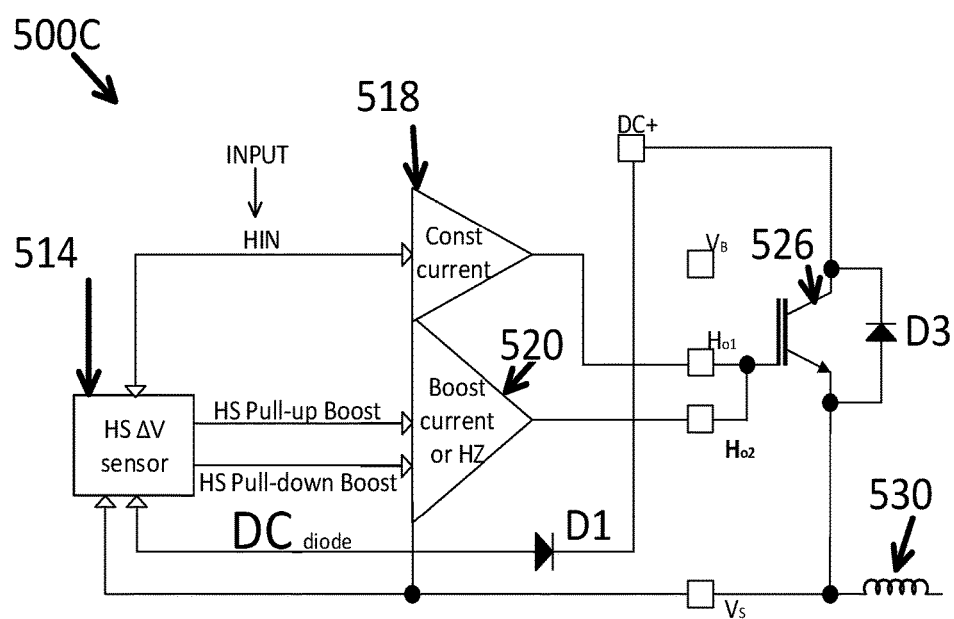
FIG. 5C is a block diagram of a gate driver, a differential voltage sensor, and a single transistor power switch referenced to a second power supply voltage according to an embodiment.

FIG. 5C is a block diagram of a power switching system 500C including a gate driver 518, 520, a hide side differential voltage sensor 514, diodes D1 and D3, and a single transistor power switch having an collector referenced to DC+ and an emitter coupled to load 530.

Figure 6:
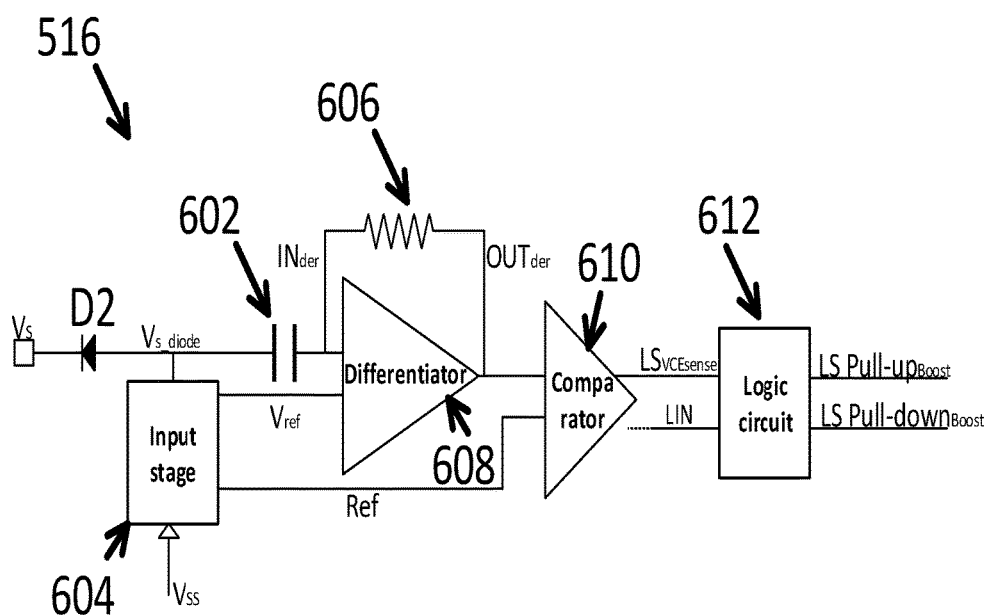
FIG. 6 is a block diagram of a low side differential voltage sensor associated with the power switching system of FIG. 5A.

FIG. 6 is a block diagram of the low side differential voltage sensor 516 associated with the power switching system 500A of FIG. 5A.

The low side sensor and differentiator circuit 516 is shown in greater detail in block diagram form in FIG. 6. Low side sensor circuit 516 includes a diode D2 previously described, and an input stage 604 for providing three references voltages including the VS_DIODE reference voltage, the VREF reference voltage, and the REF reference voltage. The input stage is shown in further detail in FIG. 14, and described in further detail below. Low side sensor and differentiator circuit 516 also includes a differentiator 608 including capacitor 602 and resistor 606, a comparator 610, and a logic circuit 612. The differentiator 608 receives the VREF reference signal and is associated with the input $IN_{DER}$ and output $OUT_{DER}$ signals. The comparator 610 receives the REF reference signal and provides the $LS_{VCESENSE}$ output signal. The logic circuit 612 receives the $LS_{VCESENSE}$ and $L_{IN}$ signals and provides the LS Pull-up Boost and LS Pull-down Boost signals. The differentiator 608 and comparator 610 may be of conventional design. Logic circuit 612 can be implemented using logic gates in an integrated circuit or as software internal or external to the integrated circuit as desired. The exact logic function for logic circuit 612 can be discerned from the various timing diagrams that are provided and described in further detail below.

In operation, once the sensed $\Delta V_{LS}$ crosses a pre-established threshold as discussed above, diode D2 provides a signal that follows the shape of the $\Delta V_{LS}$. This signal is subsequently provided to the input of the differentiator 608 together with an adaptive voltage reference ($V_{REF}$). At the input of the differentiator ($IN_{DER}$) there are pulses centered around the VREF voltage level, which are coherent with the slope of the signal provided by the input stage 604.

At the output of the differentiator 608 ($OUT_{DER}$) a pulse over the $V_{REF}$ level occurs whenever $\Delta V_{LS}$ decreases and a pulse under the $V_{REF}$ level occurs in the opposite case. This signal is input into comparator 610 which, in conjunction with reference voltage (REF), provides the $LS_{VCESENSE}$ signal.

A signal is required to provide an auxiliary current at the output of the power stage to provide a higher gate current when needed. Thus the $V_{REF}$ signal of the differentiator 608 is managed to allow the first pulse of the differentiator 608 to last as long as the power transistor is switched on. This is done because on the rising edge of this output pulse a negative auxiliary gate current is provided to the power transistor, while on the falling edge a positive one is obtained, according to the polarity of the conventional constant gate current as presently used. According to the square pulses coming from comparator 610, the power stage 522 provides current pulses that will be added, at the output, to the constant gate current provided from the driver stage 524 marked "Constant current" in FIG. 5A in order to reduce the duration of the tail of VS and thus improving the power efficiency of the switching system.

Internal waveforms for the low side of the switching system are shown in the timing diagrams of FIG. 7, FIG. 8, and FIG. 9, which are described in further detail below.

Figure 7:
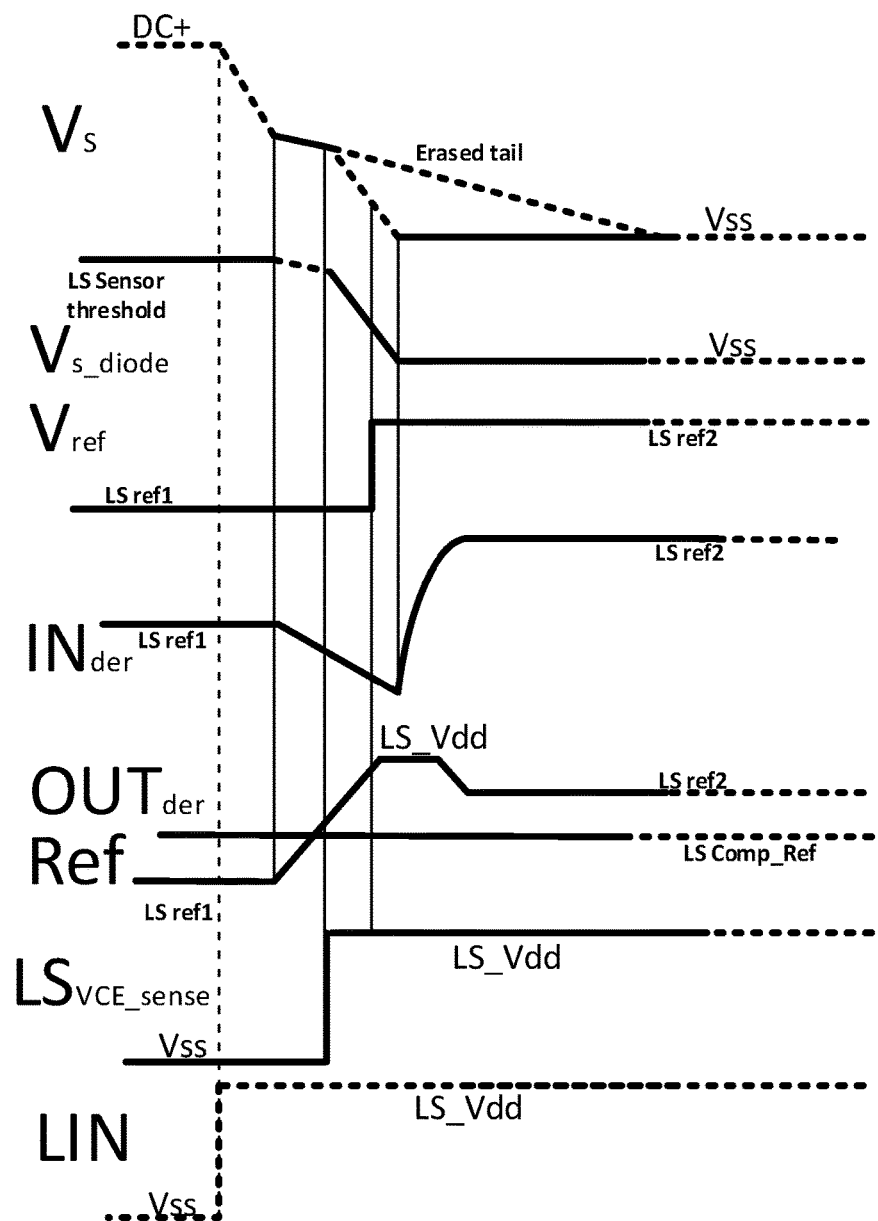
FIG. 7 is a timing diagram associated with the low side differential voltage sensor of FIG. 6 during a turn-on event.

FIG. 7 is a timing diagram associated with the low side differential voltage sensor 516 of FIG. 6 during a turn-on event including the $V_S$ output signal including an erased tail portion according to an embodiment, the $V_{S\_DIODE}$ signal, the $V_{REF}$ signal, the $IN_{DER}$ signal, the $OUT_{DER}$ signal, the REF reference voltage, the $LS_{VCESENSE}$ signal and the $L_{IN}$ input signal.

Figure 8:
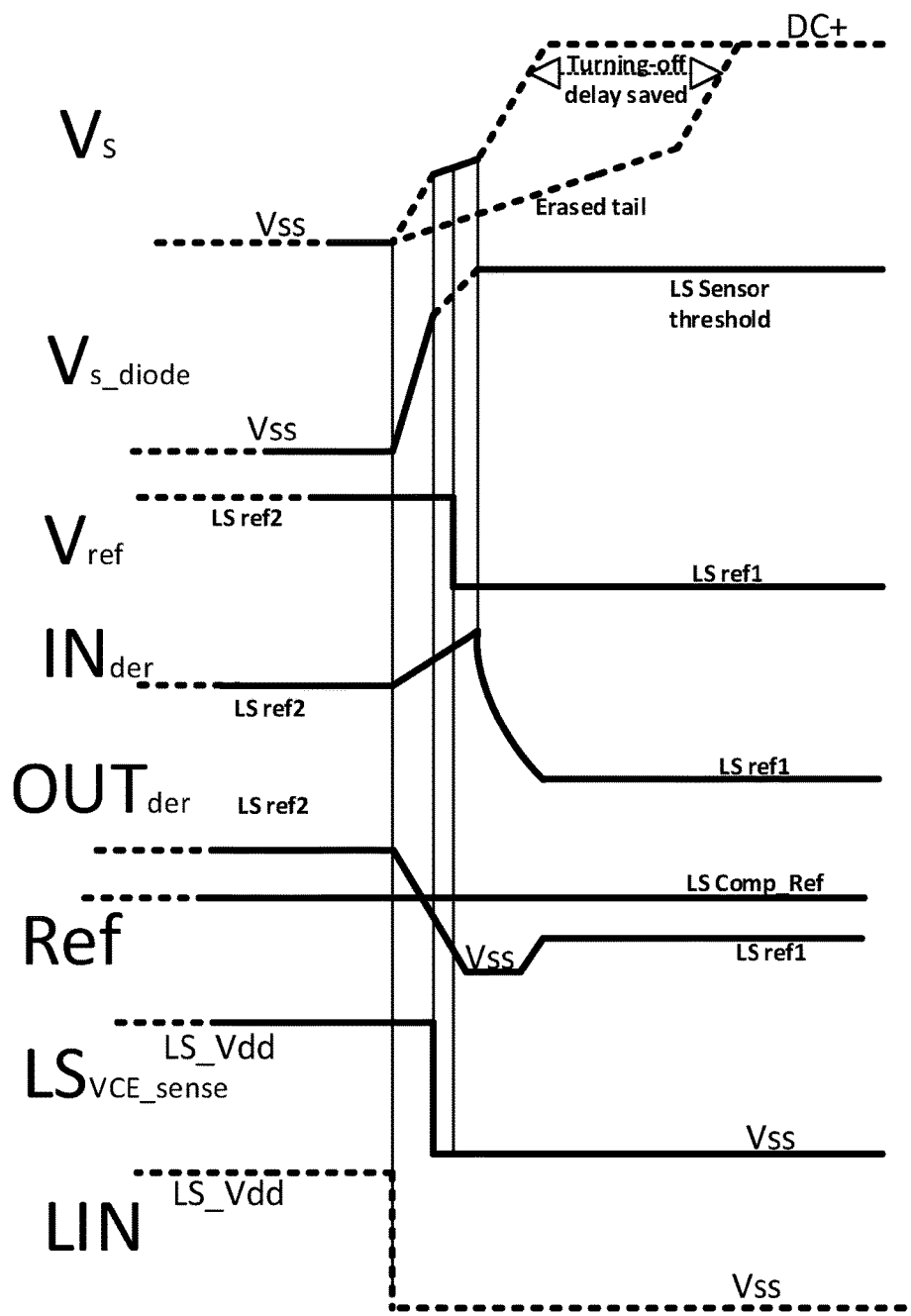
FIG. 8 is a timing diagram associated with the low side differential voltage sensor of FIG. 6 during a turn-off event.

FIG. 8 is a timing diagram associated with the low side differential voltage sensor 516 of FIG. 6 during a turn-off event including the $V_S$ output signal including an erased tail portion according to an embodiment, the $V_{S\_DIODE}$ signal, the $V_{REF}$ signal, the $IN_{DER}$ signal, the $OUT_{DER}$ signal, the REF reference voltage, the $LS_{VCESENSE}$ signal and the $L_{IN}$ input signal.

Figure 9:
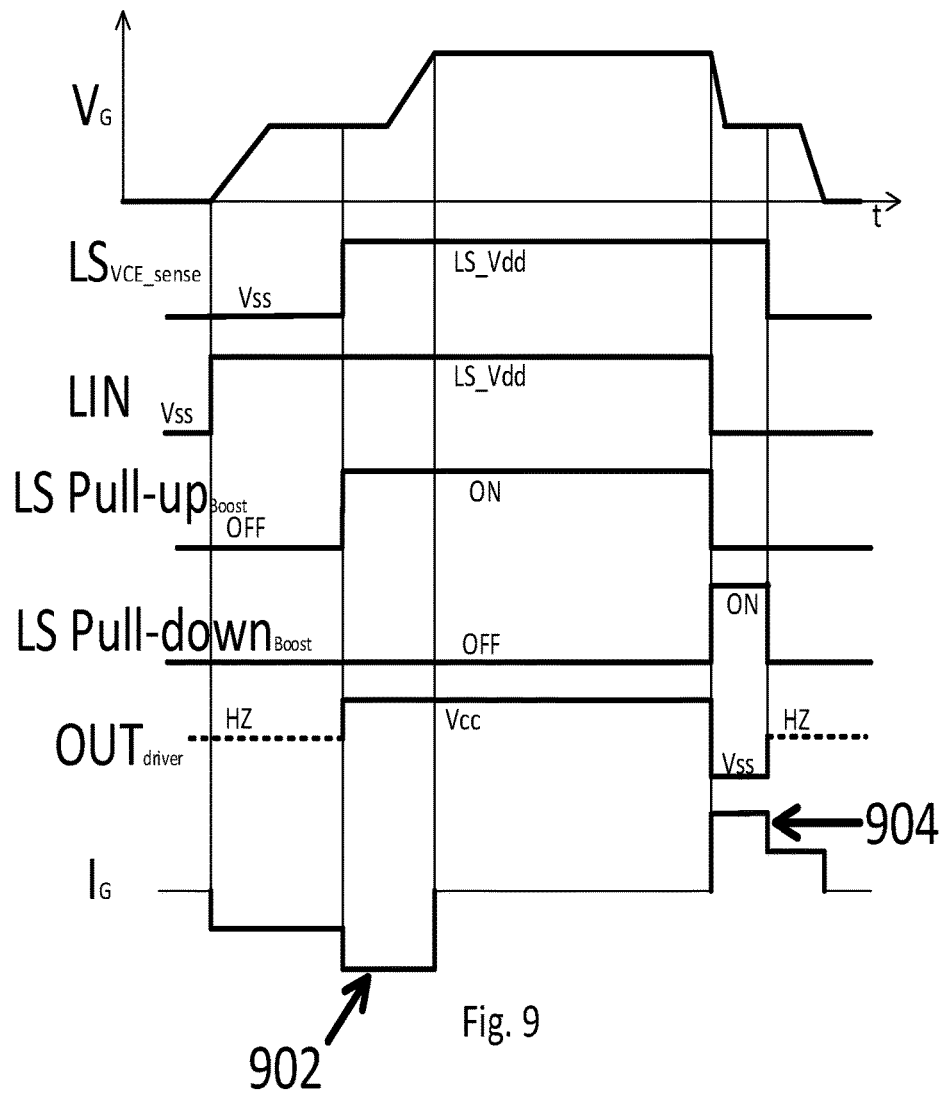
FIG. 9 is a timing diagram associated with the low side differential voltage sensor of FIG. 6 during the turn-on and turn-off events.

FIG. 9 is a timing diagram associated with the low side differential voltage sensor 516 of FIG. 6 during the turn-on and turn-off events including the $V_G$ gate voltage signal, the $LS_{VCESENSE}$ signal, the $L_{IN}$ input signal, the LS Pull-up Boost signal, the LS Pull-down Boost signal, the $OUT_{DRIVER}$ signal (output of boost driver 522), and the $I_G$ gate current signal. Note that boost gate current portions can be clearly seen in FIG. 9 including boost current portion 902 during the second portion of a turn-on event and boost current portion 904 during the first portion of a turn-off event. The un-boosted gate current portions are provided by the low side constant current driver 524.

Figure 10:
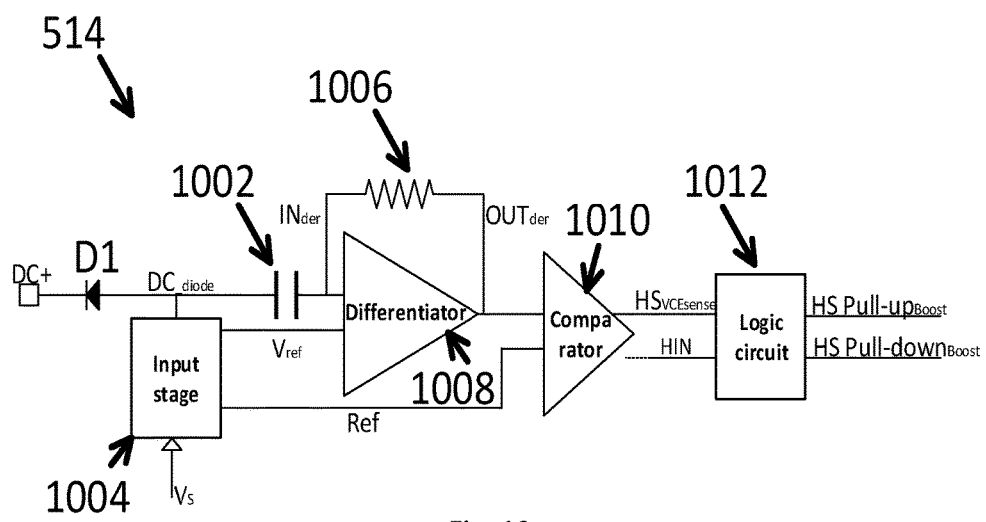
FIG. 10 is a block diagram of a high side differential voltage sensor associated with the power switching system of FIG. 5A.

FIG. 10 is a block diagram of the high side differential voltage sensor 514 associated with the power switching system 500A of FIG. 5A.

The high side sensor and differentiator circuit 516 is shown in greater detail in block diagram form in FIG. 10. High side sensor circuit 514 includes a diode D1 previously described, and an input stage 1004 for providing three references voltages including the $DC_{\_DIODE}$ reference voltage, the VREF reference voltage, and the REF reference voltage. The input stage is shown in further detail in FIG. 15, and described in further detail below. High side sensor circuit 514 also includes a differentiator 1008 including capacitor 1002 and resistor 1006, a comparator low, and a logic circuit 1012. The differentiator 1008 receives the $V_{REF}$ reference signal and is associated with the input $IN_{DER}$ and output $OUT_{DER}$ signals. The comparator 1010 receives the REF reference signal and provides the $HS_{VCESENSE}$ output signal. The logic circuit 1012 receives the $HS_{VCESENSE}$ and $H_{IN}$ signals and provides the HS Pull-up Boost and HS Pull-down Boost signals. The differentiator 1008 and comparator 1010 may be of conventional design. Logic circuit 1012 can be implemented using logic gates in an integrated circuit or as software internal or external to the integrated circuit as desired. The exact logic function for logic circuit 1012 can be discerned from the various timing diagrams that are provided and described in further detail below.

In operation, once the sensed $\Delta V_M$ crosses a pre-established threshold as discussed above, diode D1 provides a signal that follows the shape of the $\Delta V_{HS}$. This signal is subsequently provided to the input of the differentiator 1008 together with an adaptive voltage reference ($V_{REF}$). At the input of the differentiator ($IN_{DER}$) there are pulses centered around the $V_{REF}$ voltage level, which are coherent with the slope of the signal provided by the input stage 1004.

At the output of the differentiator 1008 ($OUT_{DER}$) a pulse over the $V_{REF}$ level occurs whenever $\Delta V_{HS}$ decreases and a pulse under the $V_{REF}$ level occurs in the opposite case. This signal is input into comparator 1010 which, in conjunction with reference voltage (REF), provides the $HS_{VCESENSE}$ signal.

A signal is required to provide an auxiliary current at the output of the power stage to provide a higher gate current when needed. Thus the $V_{REF}$ signal of the differentiator 1008 is managed to allow the first pulse of the differentiator 1008 to last as long as the power transistor is switched on. This is done because on the rising edge of this output pulse a negative auxiliary gate current is provided to the power transistor, while on the falling edge a positive one is obtained, according to the polarity of the conventional constant gate current as presently used. According to the square pulses coming from comparator 1010, the power stage 520 provides current pulses that will be added, at the output, to the constant gate current provided from the driver stage 518 marked "Constant current" in FIG. 5A in order to reduce the duration of the tail of $V_S$ and thus improving the power efficiency of the switching system.

Internal waveforms for the high side of the switching system are shown in the timing diagrams of FIG. 11, FIG. 12, and FIG. 13, which are described in further detail below.

Figure 11:
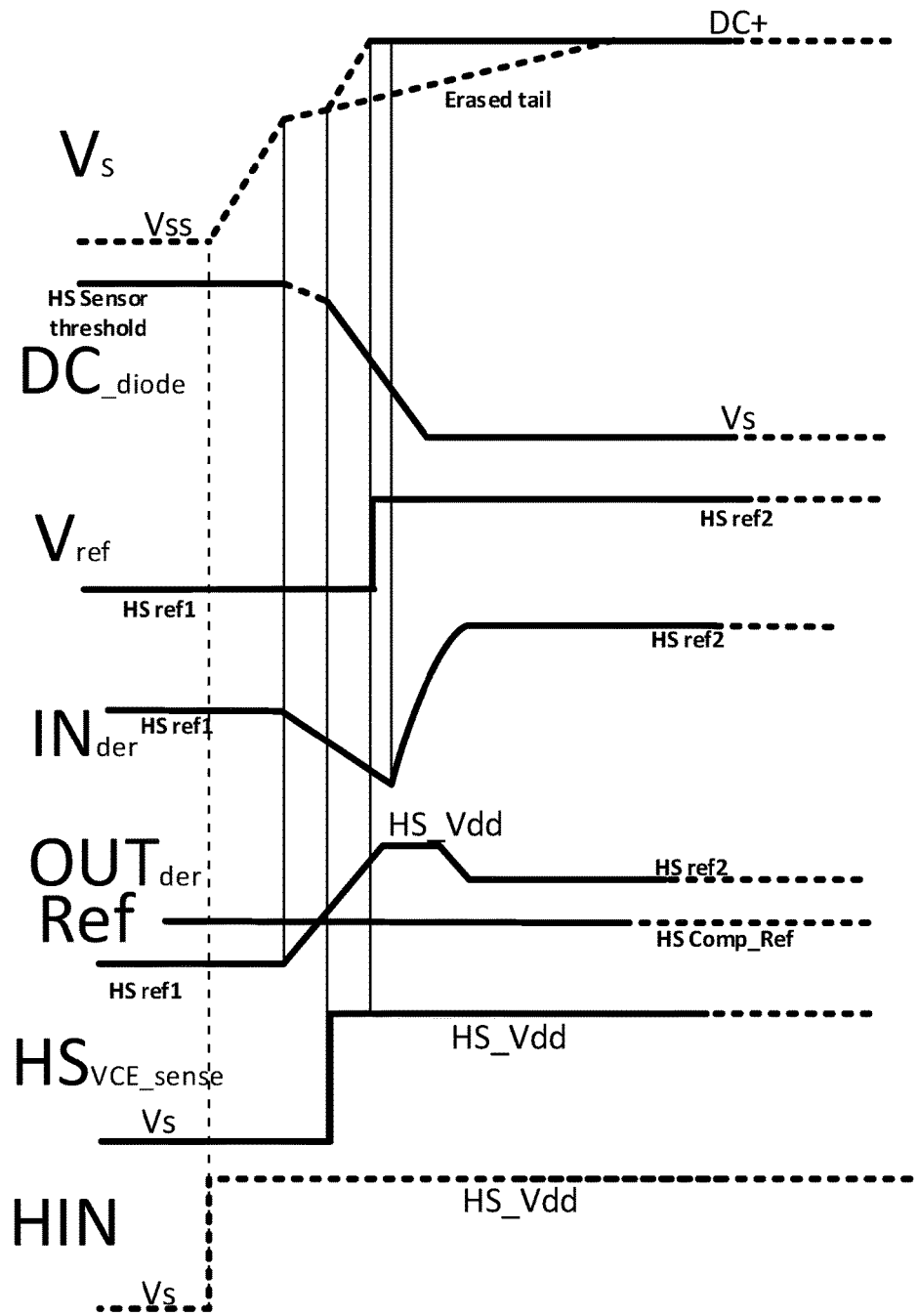
FIG. 11 is a timing diagram associated with the high side differential voltage sensor of FIG. 10 during a turn-on event.

FIG. 11 is a timing diagram associated with the high side differential voltage sensor 514 of FIG. 10 during a turn-on event including the $V_S$ output signal including an erased tail portion according to an embodiment, the $DC_{\_DIODE}$ signal, the $V_{REF}$ signal, the $IN_{DER}$ signal, the $OUT_{DER}$ signal, the REF reference voltage, the $HS_{VCESENSE}$ signal and the $H_{IN}$ input signal.

Figure 12:
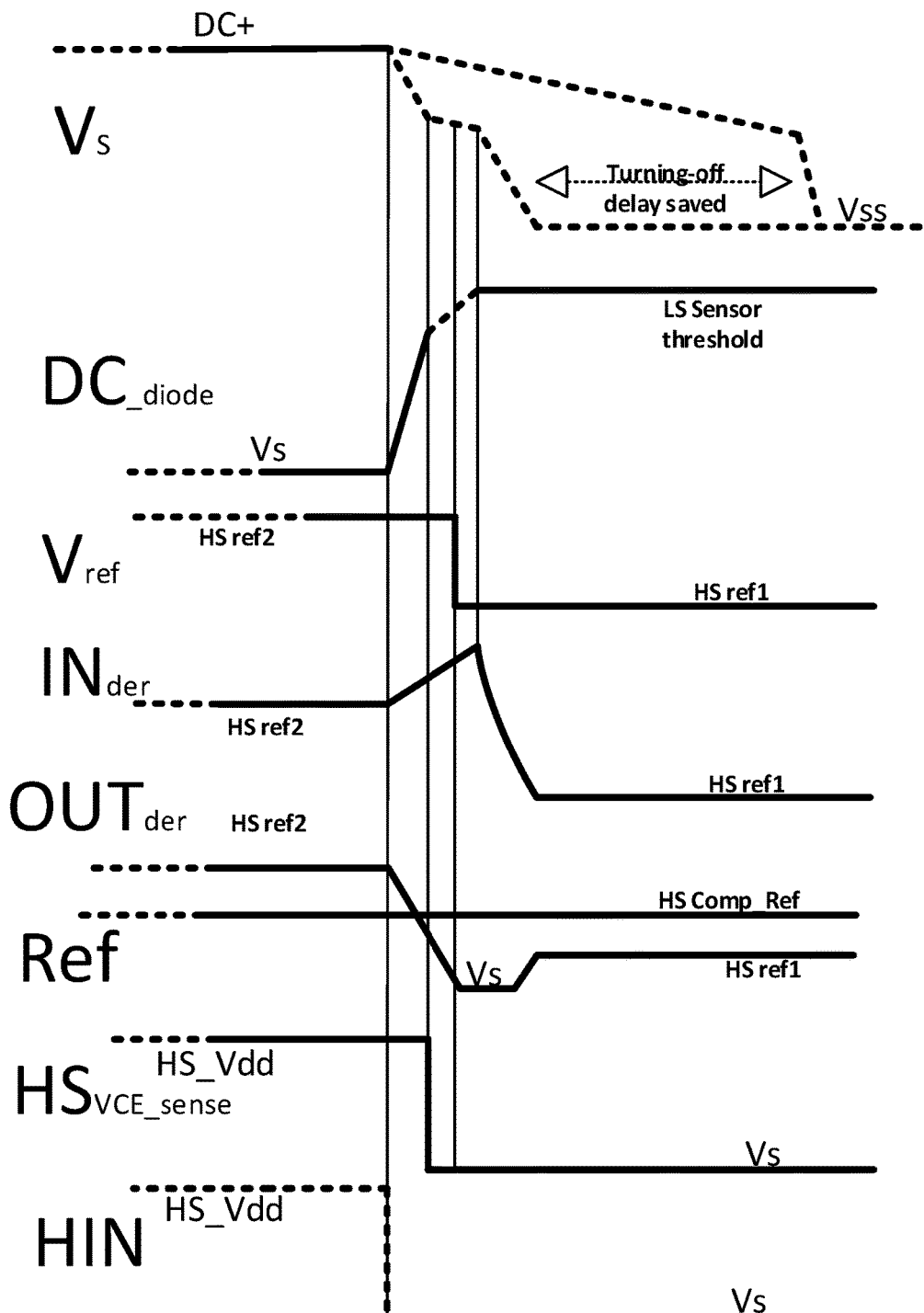
FIG. 12 is a timing diagram associated with the high side differential voltage sensor of FIG. 10 during a turn-off event.

FIG. 12 is a timing diagram associated with the high side differential voltage sensor 514 of FIG. 10 during a turn-off event including the $V_S$ output signal including an erased tail portion according to an embodiment, the $DC_{\_DIODE}$ signal, the $V_{REF}$ signal, the $IN_{DER}$ signal, the $OUT_{DER}$ signal, the REF reference voltage, the $HS_{VCESENSE}$ signal and the $H_{IN}$ input signal.

Figure 13:
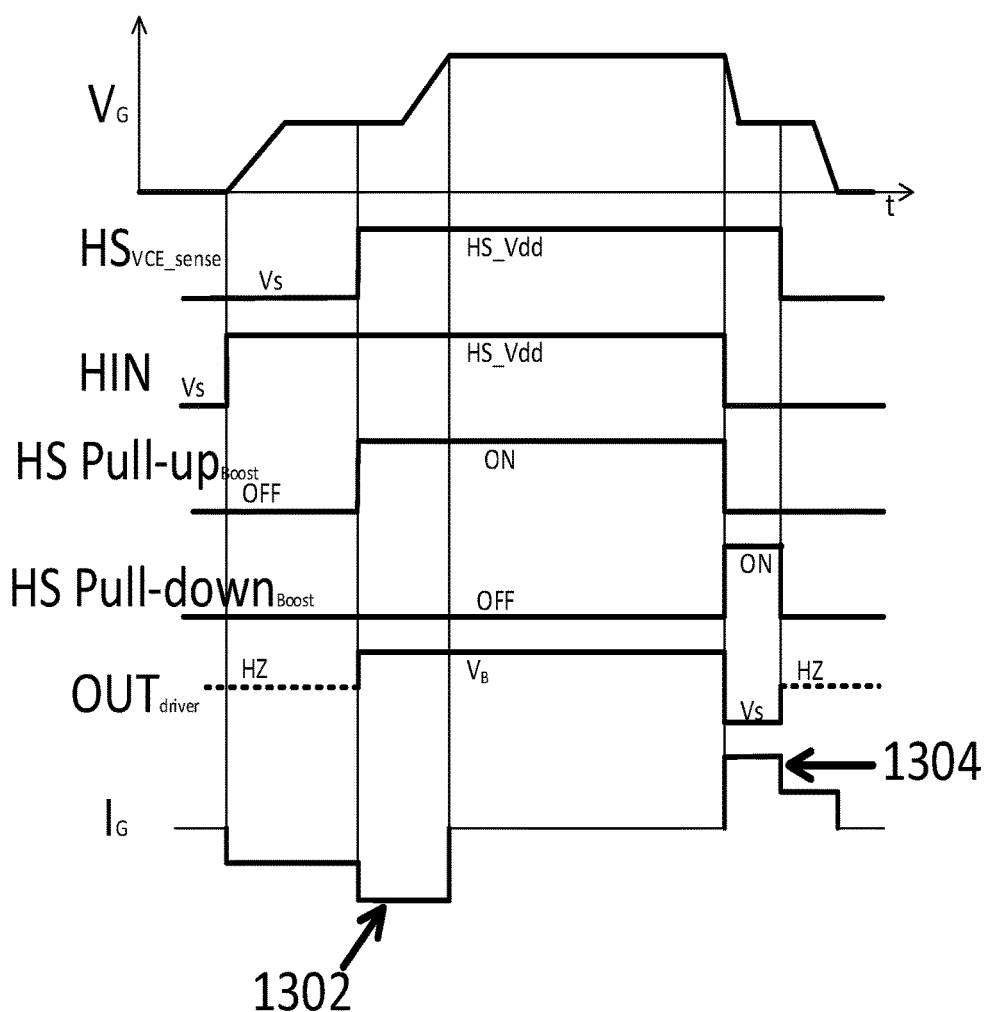
FIG. 13 is a timing diagram associated with the low side differential voltage sensor of FIG. 10 during the turn-on and turn-off events.

FIG. 13 is a timing diagram associated with the high side differential voltage sensor 514 of FIG. 10 during the turn-on and turn-off events including the $V_G$ gate voltage signal, the $HS_{VCESENSE}$ signal, the $H_{IN}$ input signal, the HS Pull-up Boost signal, the HS Pull-down Boost signal, the $OUT_{DRIVER}$ signal (output of boost driver 520), and the $I_G$ gate current signal. Note that boost gate current portions can be clearly seen in FIG. 13 including boost current portion 1302 during the second portion of a turn-on event and boost current portion 1304 during the first portion of a turn-off event. The un-boosted gate current portions are provided by the low side constant current driver 518.

FIG. 14 is an exemplary schematic diagram of the low side input stage 604 suitable for use in the low side differential voltage sensor 516 of FIG. 6. Transistor 1402 and six serially coupled diodes 1404 are used to create a reference voltage that is divided by resistors 1406 and 1408 to create the REF reference voltage. Transistor 1410 and six serially coupled diodes 1412 are used to create a reference voltage that is divided by resistors 1414, 1416, and 1418 to create the $V_{REF}$ reference voltage. Switch 1420 can be used to create two values for the $V_{REF}$ reference voltage. Transistor 1422 and four serially coupled diodes 1424, as well as Zener diode 1426 are used to create the $V_{S\_DIODE}$ maximum allowed voltage, in conjunction with diode D2 as is explained in further detail below. It is important to note that the low side input stage 604 includes a connection to both $V_S$ (through diode D2) and directly to the $V_{SS}$ power supply voltage.

In operation, the REF reference voltage is a substantially constant reference voltage above the $V_{SS}$ power supply level. The $V_{REF}$ reference voltage is a substantially constant reference voltage having a first nominal value above the $V_{SS}$ power supply level in a first mode of operation, and a second nominal value above the $V_{SS}$ power supply level in a second mode of operation. Switch 1420 is used to switch between the first and second modes of operation when $V_{S\_DIODE}$ is over a transistor threshold voltage with respect to $V_{SS}$ turning the switch 1420 on, or when $V_{S\_DIODE}$ goes under a transistor threshold voltage with respect to $V_{SS}$, turning the switch 1420 off. Finally, the $V_{S\_DIODE}$ voltage is a representative of the difference between the $V_S$ and $V_{SS}$ voltages as previously described. When $V_S$ is more positive then the $V_{S\_DIODE}$ maximum allowed voltage, the $V_{S\_DIODE}$ voltage is clamped to a nominal value above $V_{SS}$. However, when the $V_S$ voltage is more negative than the $V_{S\_DIODE}$ maximum allowed voltage, the $V_{S\_DIODE}$ voltage follows the $V_S$ voltage as can be seen in previous timing diagrams. The $V_{S\_DIODE}$ is thus a representative voltage of the voltage across the low side power device 528.

FIG. 15 is an exemplary schematic diagram of the high side input stage 1004 suitable for use in the low side differential voltage sensor 516 of FIG. 6. Transistor 1502 and six serially coupled diodes 1504 are used to create a reference voltage that is divided by resistors 1506 and 1508 to create the REF reference voltage. Transistor 1510 and six serially coupled diodes 1512 are used to create a reference voltage that is divided by resistors 1514, 1516, and 1518 to create the $V_{REF}$ reference voltage. Switch 1520 can be used to create two values for the $V_{REF}$ reference voltage. Transistor 1522 and four serially coupled diodes 1524, as well as Zener diode 1526 are used to create the $DC_{\_DIODE}$ maximum allowed voltage, in conjunction with diode D1 as is explained in further detail below. It is important to note that the low side input stage 1004 includes a connection to both DC+ (through diode D1) and directly to the $V_S$ output voltage.

In operation, the operation of the high side input stage 1004 of FIG. 15 is substantially the same as previously described with respect to the low side input stage 604 shown in FIG. 14, except for the value of the various biasing, power supply, and reference voltages.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A gate driver circuit for driving a power switch comprising:
    a gate driver having a first input for receiving an input signal and an output coupled to the power switch, the gate driver configured for providing a primary gate current and an auxiliary gate current; and
    a differential voltage sensor having a first input for receiving the input signal, a second input coupled to a power supply voltage, a third input coupled to a terminal of the power switch, and an output coupled to a second input of the gate driver,
    wherein the gate driver comprises a primary driver configured for providing the primary gate current and an auxiliary driver configured for providing the auxiliary gate current, and
    wherein the primary driver is coupled to the first input of the gate driver and the auxiliary driver is coupled to the second input of the gate driver.

2. The gate driver circuit of claim 1, wherein the differential voltage sensor comprises:
    a differentiator having an input coupled to an input of the differential voltage sensor, and an input coupled to a differentiator reference voltage;
    a comparator having an input coupled to the output of the differentiator, an input coupled to a comparator reference voltage, and an output; and
    a logic circuit having a first input coupled to the output of the comparator, a second input for receiving the input signal, and an output coupled to the output of the differential voltage sensor.

3. The gate driver circuit of claim 2, wherein the differential voltage sensor further comprises an input stage for generating the reference voltages for the differentiator and the comparator.

4. The gate driver circuit of claim 1, further comprising a diode coupled between the second input of the differential voltage sensor and the power supply voltage.

5. The gate driver circuit of claim 1, further comprising a diode coupled between the third input of the differential voltage sensor and the terminal of the power switch.

6. A gate driver circuit for driving a power switch comprising:
    a first primary driver having an input for receiving a first input signal and an output for providing a first gate current;
    a first auxiliary driver having an input and an output for providing a first auxiliary gate current;
    a first differential voltage sensor having a first input for receiving the first input signal, a second input coupled to a first power supply voltage, a third input coupled to a terminal of the power switch, and an output coupled to the input of the first auxiliary driver;
    a second primary driver having an input for receiving a second input signal and an output for providing a second gate current;
    a second auxiliary driver having an input and an output for providing a second auxiliary gate current; and
    a second differential voltage sensor having a first input for receiving the second input signal, a second input coupled to a second power supply voltage, a third input coupled to the terminal of the power switch, and an output coupled to the input of the second auxiliary driver.

7. The gate driver circuit of claim 6, wherein the first differential voltage sensor comprises:
    a differentiator having an input coupled to an input of the first differential voltage sensor, and an input coupled to a differentiator reference voltage;
    a comparator having an input coupled to an output of the differentiator and an input coupled to a comparator reference voltage; and
    a logic circuit having a first input coupled to an output of the comparator, a second input for receiving the first input signal, and an output coupled to the output of the first differential voltage sensor.

8. The gate driver circuit of claim 7, wherein the first differential voltage sensor further comprises an input stage for generating the reference voltages for the differentiator and the comparator.

9. The gate driver circuit of claim 7, wherein the logic circuit comprises first and second outputs for driving first and second inputs of the first auxiliary driver.

10. The gate driver circuit of claim 6, wherein the second differential voltage sensor comprises:
- a differentiator having an input coupled to an input of the second differential voltage sensor, and an input coupled to a differentiator reference voltage;
- a comparator having an input coupled to an output of the differentiator and an input coupled to a comparator reference voltage; and
- a logic circuit having a first input coupled to an output of the comparator, a second input for receiving the second input signal, and an output coupled to the output of the second differential voltage sensor.

11. The gate driver circuit of claim 10, wherein the second differential voltage sensor further comprises an input stage for generating the reference voltages for the differentiator and the comparator.

12. The gate driver circuit of claim 10, wherein the logic circuit comprises first and second outputs for driving first and second inputs of the second auxiliary driver.

13. A method for switching a half-bridge circuit including a high side device and a low side device, the method comprising:
- driving a control node of the high side device with a first current pulse having a first pulse width;
- driving the control node of the high side device with a second current pulse during a duration of the first current pulse, having a second pulse width shorter than the first pulse width;
- driving a control node of the low side device with a third current pulse having a third pulse width; and
- driving the control node of the low side device with a fourth current pulse during a duration of the third current pulse, having a fourth pulse width shorter than the third pulse width.

14. The method of claim 13, wherein the first current pulse occurs during first and second portions of a turn-on event of the high side device, and the second current pulse occurs only during the second portion of the turn-on event.

15. The method of claim 13, wherein the first current pulse occurs during first and second portions of a turn-off event of the high side device, and the second current pulse occurs only during the first portion of the turn-off event.

16. The method of claim 13, wherein the third current pulse occurs during first and second portions of a turn-on event of the low side device, and the fourth current pulse occurs only during the second portion of the turn-on event.

17. The method of claim 13, wherein the third current pulse occurs during first and second portions of a turn-off event of the low side device, and the fourth current pulse occurs only during the first portion of the turn-off event.

18. The method of claim 13, wherein the second pulse width is determined by sensing and differentiating a voltage across the high side device, and wherein the fourth pulse width is determined by sensing and differentiating a voltage across the low side device.

19. A gate driver circuit for driving a power switch comprising:
- a gate driver having a first input for receiving an input signal and an output coupled to the power switch, the gate driver configured for providing a primary gate current and an auxiliary gate current; and
- a differential voltage sensor having a first input for receiving the input signal, a second input coupled to a power supply voltage, a third input coupled to a terminal of the power switch, and an output coupled to a second input of the gate driver,
- wherein the differential voltage sensor comprises a differentiator having an input coupled to an input of the differential voltage sensor, and an input coupled to a differentiator reference voltage; a comparator having an input coupled to the output of the differentiator, an input coupled to a comparator reference voltage, and an output; and a logic circuit having a first input coupled to the output of the comparator, a second input for receiving the input signal, and an output coupled to the output of the differential voltage sensor.

20. The gate driver circuit of claim 19, wherein the differential voltage sensor further comprises an input stage for generating the reference voltages for the differentiator and the comparator.

21. A gate driver circuit for driving a power switch comprising:
- a gate driver having a first input for receiving an input signal and an output coupled to the power switch, the gate driver configured for providing a primary gate current and an auxiliary gate current;
- a differential voltage sensor having a first input for receiving the input signal, a second input coupled to a power supply voltage, a third input coupled to a terminal of the power switch, and an output coupled to a second input of the gate driver; and
- a diode coupled between the second input of the differential voltage sensor and the power supply voltage.

* * * * *